United States Patent
Tai et al.

(10) Patent No.: US 11,620,085 B2
(45) Date of Patent: *Apr. 4, 2023

(54) MANAGEMENT OF WRITE OPERATIONS IN A NON-VOLATILE MEMORY DEVICE USING A VARIABLE PRE-READ VOLTAGE LEVEL

(71) Applicant: MICRON TECHNOLOGY, INC., Boise, ID (US)

(72) Inventors: Ying Yu Tai, Mountain View, CA (US); Jiangli Zhu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/506,246

(22) Filed: Oct. 20, 2021

(65) Prior Publication Data

US 2022/0035572 A1 Feb. 3, 2022

Related U.S. Application Data

(63) Continuation of application No. 16/777,766, filed on Jan. 30, 2020, now Pat. No. 11,199,999.

(51) Int. Cl.
*G06F 3/06* (2006.01)

(52) U.S. Cl.
CPC .......... *G06F 3/0659* (2013.01); *G06F 3/0604* (2013.01); *G06F 3/0619* (2013.01); *G06F 3/0653* (2013.01); *G06F 3/0679* (2013.01)

(58) Field of Classification Search
CPC .... G06F 3/0659; G06F 3/0653; G06F 3/0604; G06F 3/0679; G06F 9/30101;
(Continued)

(56) References Cited

U.S. PATENT DOCUMENTS

| 10,026,486 | B1 | 7/2018 | Dutta et al. |
| 2008/0086677 | A1 | 4/2008 | Yang et al. |

(Continued)

OTHER PUBLICATIONS

PCT International Search Report and Written Opinion for International Application No. PCT/US2021/015889, dated May 24, 2021, 10 pages.
(Continued)

*Primary Examiner* — Reginald G Bragdon
*Assistant Examiner* — Curtis James Kortman
(74) *Attorney, Agent, or Firm* — Lowenstein Sandler LLP

(57) ABSTRACT

A processing device, operatively coupled with a memory device, performs operations including receiving a write request from a host system at a first time, the write request identifying first data to be stored in a segment of the memory device, determining whether a pre-read voltage level of the write request satisfies a pre-read voltage level criterion pertaining to a write-to-write time interval for the segment, wherein the write-to-write time interval is defined by the first time and a second time corresponding to a last time at which the segment was written, and responsive to determining that the pre-read voltage level satisfies the pre-read voltage level criterion pertaining to the write-to-write time interval, performing a pre-read operation on the segment using the pre-read voltage level to determine second data currently stored in the segment.

20 Claims, 6 Drawing Sheets

(58) Field of Classification Search
CPC ..... G11C 16/34; G11C 16/3404; G11C 16/10; G11C 16/26; G11C 11/5642; G11C 29/42
See application file for complete search history.

(56) References Cited

U.S. PATENT DOCUMENTS

| | | |
|---|---|---|
| 2013/0254498 A1 | 9/2013 | Adachi et al. |
| 2015/0234749 A1* | 8/2015 | Adachi ............... G11C 11/1675 711/159 |
| 2018/0122448 A1 | 5/2018 | Berger et al. |
| 2018/0197587 A1 | 7/2018 | Lee et al. |
| 2019/0012228 A1 | 1/2019 | Hsiao et al. |
| 2019/0074058 A1 | 3/2019 | Taub et al. |
| 2019/0267100 A1* | 8/2019 | Pan ........................ G11C 16/26 |
| 2020/0381036 A1 | 12/2020 | Park |

OTHER PUBLICATIONS

USPTO, Office Action for U.S. Appl. No. 16/777,766, dated Jun. 7, 2021.
USPTO, Notice of Allowance for U.S. Appl. No. 16/777,766, dated Aug. 12, 2021.
PCT Notification Concerning Transmittal of Copy of International Preliminary Report on Patentability for PCT Application No. PCT/US2021/015889, dated Aug. 11, 2022, 6 pages.

* cited by examiner

US 11,620,085 B2

MANAGEMENT OF WRITE OPERATIONS IN A NON-VOLATILE MEMORY DEVICE USING A VARIABLE PRE-READ VOLTAGE LEVEL

RELATED APPLICATIONS

This application is a continuation of U.S. patent application Ser. No. 16/777,766 filed on Jan. 30, 2020, which is incorporated herein by reference in its entirety for all purposes.

TECHNICAL FIELD

The present disclosure generally relates to memory sub-systems, and more specifically, relates to management of write operations in a non-volatile memory device using a variable pre-read voltage level.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
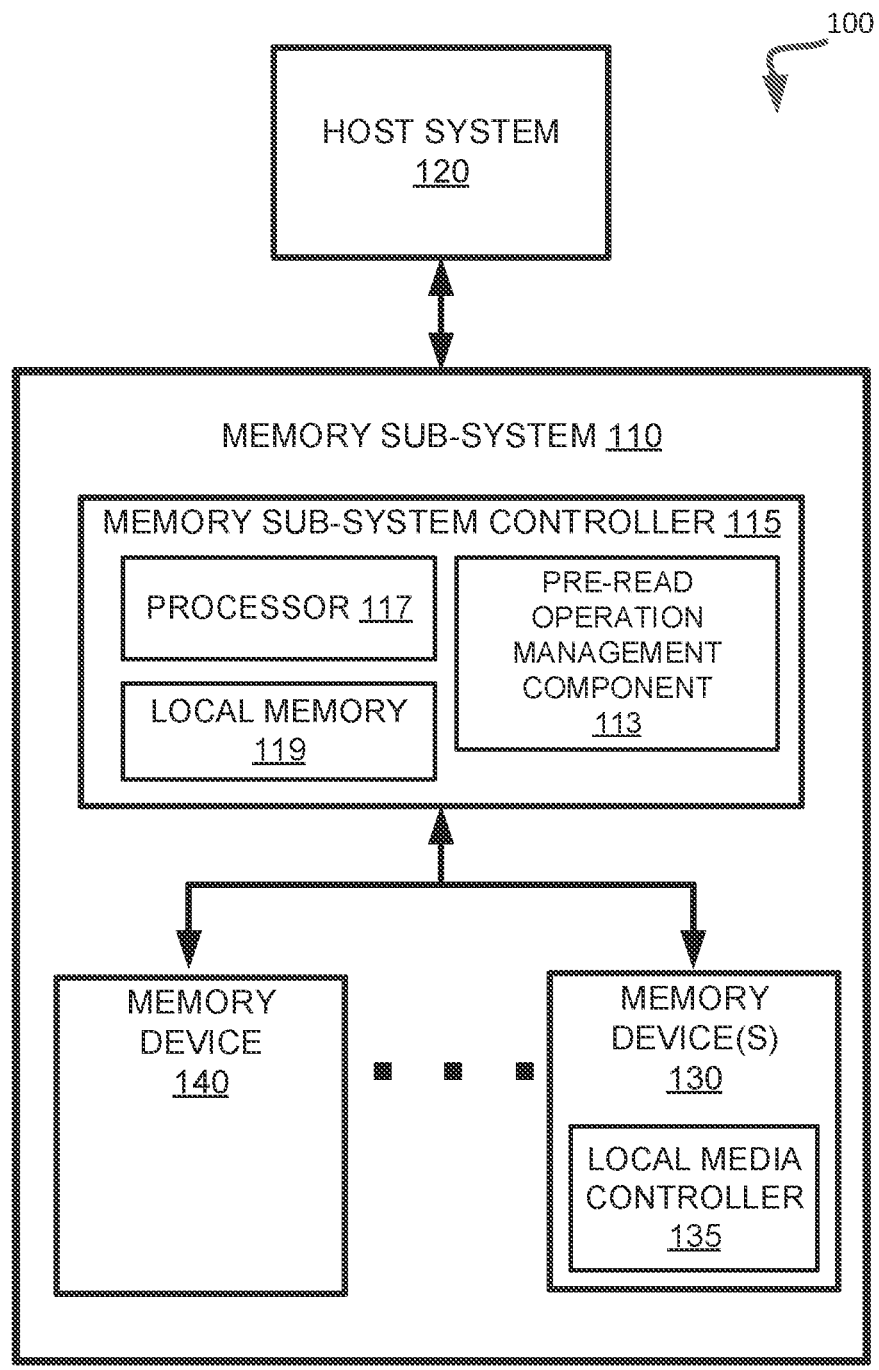
FIG. 1 illustrates an example computing system for supporting write operations in a non-volatile memory device using a variable pre-read voltage level, in accordance with some embodiments of the present disclosure.

Aspects of the present disclosure are directed to managing a variable pre-read voltage level when performing a pre-read operation that precedes a write operation of data in memory devices of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices that store data. The host system can provide data to be stored at the memory sub-system and can request data to be retrieved from the memory sub-system.

A memory sub-system can include multiple memory devices that can store data from a host system. A memory device can be a non-volatile memory device. A non-volatile memory device is a package of one or more dice. The memory devices can be non-volatile memory devices, such as three-dimensional cross-point ("3D cross-point") memory devices that are a cross-point array of non-volatile memory that can perform bit storage based on a change of bulk resistance, in conjunction with a stackable cross-gridded data access array. Another example of a non-volatile memory device is a negative-and (NAND) memory device. Other examples of non-volatile memory devices are described below in conjunction with FIG. 1. The dice in the packages can be assigned to one or more channels for communicating with a memory sub-system controller. Each die can consist of one or more planes. Planes can be groups into logic units (LUN). For some types of non-volatile memory devices (e.g., NAND memory devices), each plane consists of a set of physical blocks, which are groups of memory cells to store data. A cell is an electronic circuit that stores information.

Non-volatile memory (NVM) devices are commonly used due to their improved read/write performance and minimal latency. They are also very popular for memory and storage systems due to their read/write latency performance. One type of NVM device performs in-place data replacement, such as phase change memory (PCM), which can allow existing data to be replaced with new data without performing an erase operation. One way of achieving the increased performance in a NVM device is write only the subset of the new data that is different than the data already stored in the same memory unit. In order to determine the data currently stored at the memory unit, the memory sub-system can perform a pre-read operation before the write operation. The memory sub-system can compare the data obtained during the pre-read operation with the new data to be stored during the write operation. Therefore, the accuracy of the pre-read operation is critical for the accuracy of the write operation and the reliability of the overall memory device.

Just like a read operation, pre-read operations are performed using a pre-read voltage level that can affect the error rate of the data obtained by the pre-read operation. For certain memory types (i.e., for memory sub-systems employing certain types of storage media), the error rate can vary over time. In particular, some non-volatile memories have threshold voltage (Vt) distributions that move as a function of time. At a given pre-read level (i.e., the voltage applied to a memory cell as part of a pre-read operation), if the Vt distributions move, then certain reliability statistics can also be affected. One example of a reliability statistic is a raw bit error rate (RBER). The RBER can be defined as the ratio of the number of erroneous bits to the number of all data bits stored in a data unit of the memory sub-system, where the data unit can be the entire memory sub-system, a die of a memory device, a collection of codewords, a collection of memory device pages, a collection of memory device blocks, or any other meaningful portion of the memory sub-system. For any Vt distribution at an instance in time, there can be an optimal pre-read voltage level (or a pre-read level range) that minimizes the expected RBER. In particular, the Vt distribution and RBER can be a function of the time since the data unit was programmed (i.e., the period of time that passes since data was written to the data unit). Due to this time-varying nature of RBER, as well as other noise mechanisms in memory, a single pre-read voltage level may not be sufficient to achieve an error rate that satisfies certain system reliability targets.

Conventionally, pre-read operations are performed using a fixed pre-read voltage level. For example, the pre-read voltage level can yield proper data when the data is read within milliseconds of the data being programmed to the data unit. However, because the pre-read voltage level does not get updated, it may not yield acceptable read results when the pre-read operation occurs minutes or hours after the data has been programmed in the data unit. In this case, a conventional solution is to read the data from the memory device and transfer it to the controller of the memory sub-system. The controller then can use error handling mechanisms to decode and correct errors in the data obtained by the pre-read operation. The controller can then compare the decoded data with the new data and can determine the bits of data that are different. While this approach can correct data that may contain errors due to the usage of an inapplicable pre-read voltage level for the pre-read operation, this approach can introduce overhead on the memory sub-system controller due to the additional processing done by the controller. Additionally, latency of the memory device can increase due to the extra steps of transferring data to the controller which further consumes the bandwidth of the controller, resulting in a drop in the controller throughput.

Aspects of the present disclosure address the above and other deficiencies by supporting write operations for data units in a non-volatile memory devices based on a variable pre-read voltage level for pre-read operations. In implementations, when the memory sub-system receives a write request to store new data in a segment of a memory device, the memory sub-system can perform a pre-read operation before performing the write operation. The memory sub-system can perform the pre-read operation to obtain the data currently stored at the segment, compare the currently stored data and the data received with the write request, and then only write the bits of data that are different than what is already stored in the segment. The segment can refer to one or more data units of the memory device, and each data unit can represent the smallest amount of memory on which a write operation can be performed.

In an implementation, the pre-read operation can be performed using a pre-read voltage level that can be determined based on the last time data was programmed or stored in the segment. In this case, the memory sub-system can determine a write-to-write time interval for the segment, and can determine a corresponding pre-read voltage level to be used when performing the pre-read operation. The write-to-write time interval can refer to an interval of time between the last time data was written to the segment (e.g., by reading a time stamp associated with the segment) and the time the write request was received for the segment.

When the write-to-write (W2W) time interval for the segment is determined, the memory sub-system can determine a pre-read voltage level by determining whether the W2W time interval falls within a first range of W2W time intervals having a corresponding first pre-read voltage level of the memory device. In an implementation, the memory device can have multiple ranges of W2W time intervals, each range is associated with a corresponding pre-read voltage level. If the W2W time interval of the segment falls within the first range of W2W time intervals, the first pre-read voltage can be used for performing the pre-read operation.

When the pre-read voltage level is determined based on the W2W time interval of the segment, the memory sub-system can perform the pre-read operation using the determined pre-read voltage, in order to obtain the data currently stored in the segment. The memory sub-system can then compare the obtained data with the new data that was received with the write request to be stored at the segment. The memory sub-system can then proceed to write in the segment the bits of the new data that are different than the corresponding bits of existing data currently stored in the segment.

The techniques described herein of supporting a variable pre-read voltage level when performing a pre-read operation before performing a write operation enables an improved overall performance of the NVM devices. In memory devices where the voltage distribution of memory cells is shifting frequently, the passing pre-read voltage level can vary significantly based on the time a data unit was programmed. Therefore, by having a variable pre-read voltage level for pre-read operations of a data unit based on the time elapsed since the data unit was programmed, the reliability and accuracy of the pre-read operation can increase significantly, without having to trigger a time consuming read error handling module to correct the pre-read voltage level as often. Additionally, because this approach can be implemented in the memory device, there is no need to transfer data to the controller of the memory sub-system in order to perform error correcting mechanisms. Eliminating the data transfer step removes the additional overhead of processing done by the controller as well as reduces the controller bandwidth consumption that can result by transferring data back and forth between the controller and the memory device with each write operation. Therefore, the techniques described herein of supporting a variable pre-read voltage level, based on last program time of a data unit, when performing a pre-read operation of the data unit reduce the overhead of additional processing by the controller while improving the reliability of the differential write operation in non-volatile memory devices, which improves the overall performance of the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A 3D cross-point memory device is a cross-point array of non-volatile memory cells that can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks. Some types of memory, such as 3D cross-point, can group pages across dice and channels to form management units (MUs).

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric random access memory (FeRAM), ferroelectric transistor random-access memory (FeTRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes pre-read operation management component 113 that can be used to support write operations for data units in a non-volatile memory devices based on a variable pre-read voltage level for pre-read operations. In implementations, when host system 120 sends a write request to memory sub-system 110 to store certain data in a segment of memory devices 130-140, memory sub-system 110 can perform a pre-read operation before performing the requested write operation. The segment can be any physical or logical portion of the memory device, such as a collection of codewords, or a management unit, for example. The segment can further refer to one or more data units of the memory device, and each data unit can represent the smallest amount of memory on which a write operation can be performed.

In certain implementations, the pre-read operation can be used to obtain data currently stored in the segment, such that the current data can be compared with the new data requested to be stored to determine bits of the new data that are different than corresponding bits of the currently stored data. In this case, memory sub-system 110 can write only the bits of data that are different than the currently stored data in the segment. After determining the bits of the new data that are different than what is already stored in the segment, memory sub-system 110 can proceed to perform a write operation to store the determined bits of the new data in the segment.

In an implementation, the pre-read operation can be performed using a certain pre-read voltage level that can be determined by pre-read operation management component 113 based on the last time data was programmed or stored in the segment. For example, pre-read operation management component 113 can determine a write-to-write time interval for the segment, and can determine a corresponding pre-read voltage level to be used when performing the pre-read operation. In certain implementations, a write-to-write time interval can refer to an interval of time between the last time data was written to the segment and the time the write request was received for the segment. For example, pre-read operation management component 113 can store a time stamp value representing the last time data has been written to the segment, or a group of segments, in order to determine the W2 W time interval for the segment.

When the write-to-write (W2 W) time interval for the segment is determined, pre-read operation management component 113 can determine a pre-read voltage level by determining whether the W2 W time interval falls within a first range of W2 W time intervals having a corresponding first pre-read voltage level of a memory device 130-140. In an implementation, memory device 130 can have two ranges of W2 W time intervals, each range represents voltage distribution that results in minimum error rate when the corresponding pre-read voltage level is used for a read operation. In this case, if the W2 W time interval of the segment falls within the first range of W2 W time intervals, the first pre-read voltage can be used for performing the pre-read operation. On the other hand, if the W2 W time interval of the segment falls within the second range of W2 W time intervals, the second pre-read voltage can be used for performing the pre-read operation.

When the pre-read voltage level is determined based on the W2 W time interval of the segment, pre-read operation management component 113 can perform a pre-read operation using the determined pre-read voltage, in order to obtain the data currently stored in the segment. Pre-read operation management component 113 can then compare the obtained data with the new data that was received with the write request to be stored at the segment. In certain non-volatile memory devices (e.g. a 3D cross-point memory device) the write operation can be performed such that only data that is different than what is currently stored at the segment of memory can be written. In an example, pre-read operation management component 113 can compare each bit of data currently stored in the segment with a corresponding bit of new data to be stored at the segment and if the two bits are different then the corresponding bit of the new data can be marked as different. If the two bits are identical, then the corresponding bit of the new data can be marked as identical. When all bits are compared and marked as relevant, only the bit of the new data that are marked as different can be written to the segment.

Figure 2:
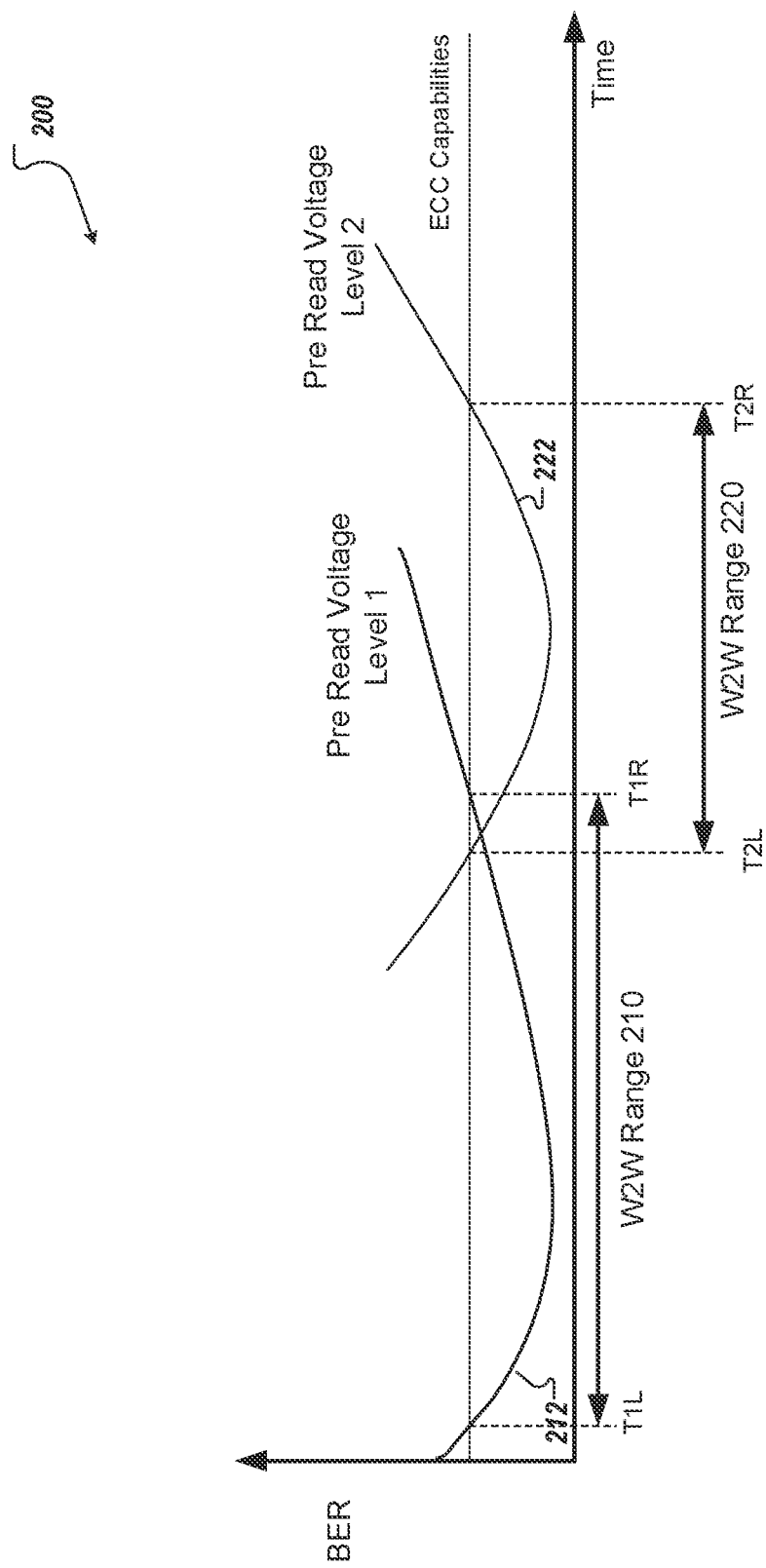
FIG. 2 is a graph illustrating the bit error rate (BER) as a function of write-to-write (W2 W) time intervals for two pre-read voltage levels in accordance with some embodiments of the present disclosure.

FIG. 2 is a graph 200 that illustrates the bit error rate (BER) as a function of write-to-write (W2 W) time intervals for two pre-read voltage levels in accordance with some embodiments of the present disclosure. As described herein, Vt distributions can shift over time. For example, for a given pre-read voltage level, such as Pre-Read Level 1, the bit error rate experienced when pre-read operations are performed using this pre-read voltage level can change as a function of time due to the intrinsic movement of Vt distributions. Similarly, the corresponding bit error rates of Pre-Read Level 2 can also change as a function of time. In these or other situations, the Vt distribution and bit error rate can be a function of the W2 W time interval that represents time elapsed since a given data unit is last programmed. Graph 200 shows that each of the two pre-read voltage levels correspond to a different range of W2 W times, such as W2 W Range 210 and W2 W Range 220, which can be design targets from memory sub-system specifications. In other embodiments, there can be any other number of ranges of W2 W time intervals and associated pre-read voltage levels.

In graph 200, the measured BER is displayed for pre-read operations performed using a designated pre-read voltage level. For example, BER curve 212 represents the BER measured for pre-read operations performed using Pre-Read Level 1 on segments of different W2 W time intervals, BER curve 222 represents the BER measured for pre-read operations performed using Pre-Read Level 2 on segments of different W2 W time intervals. It is evident from graph 200 that using Pre-Read Level 1 results in a lower BER for pre-read operations performed on segments of the memory component having W2 W time intervals that fall within W2 W Range 210 and using Pre-Read Level 2 results in a lower BER for pre-read operations performed on segments of the memory device having W2 W time intervals that fall within W2 W Range 220. In an illustrative example, W2 W Range 210 can include time intervals between T1L (e.g., 1 millisecond) and T1R (e.g., 1 minute). In this case, segments that were programmed anywhere from 1 millisecond to 1 minute ago can use Pre-Read Voltage Level 1 for performing the pre-read operation. On the other hand, W2 W Range 220 can include time intervals between T2L (e.g., 1 second) and T1R (e.g., 10 hours). In this case, segments that were programmed anywhere from 1 second to 10 hours ago can use Pre-Read Voltage Level 2 for performing the pre-read operation. In this example, memory sub-system 110 can be configured to trigger a write request for segments every 10 hours, such that each segment can have a maximum W2 W time interval of 10 hours. Additionally, if a given W2 W time interval for a segment is a time that falls within both W2 W Ranges (e.g., W2 W time interval is more than 1 second AND less than 1 minute), memory sub-system 110 can determine that either Pre-Read Voltage Level 1 or Pre-Read Voltage Level 2 can be used for the pre-read operation of the segment because either pre-read voltage level can yield an acceptable BER. For example, an acceptable BER can refer to an error rate that is within the error control coding (ECC) capabilities of the memory device. The Memory sub-system 110 can then use either Pre-Read Voltage Level 1 or Pre-Read Voltage Level 2 to perform the pre-read operation for the segment.

Graph 200 also illustrates that for a single pre-read level (e.g., Pre-Read Voltage Level 2), the BER increases at lower W2 W time intervals (i.e., W2 W times<T2L) and at higher W2 W time intervals (i.e., W2 W times>T2R). In one implementation, Pre-Read Voltage Level 1 is the lowest voltage and Pre-Read Voltage Level 2 has a higher voltage than Pre-Read Voltage Level 1. The values of Pre-Read Voltage Level 1 and Pre-Read Voltage Level 2 can be set during production of the memory device, but can optionally be adjusted during the lifetime of the memory device.

Figure 3:
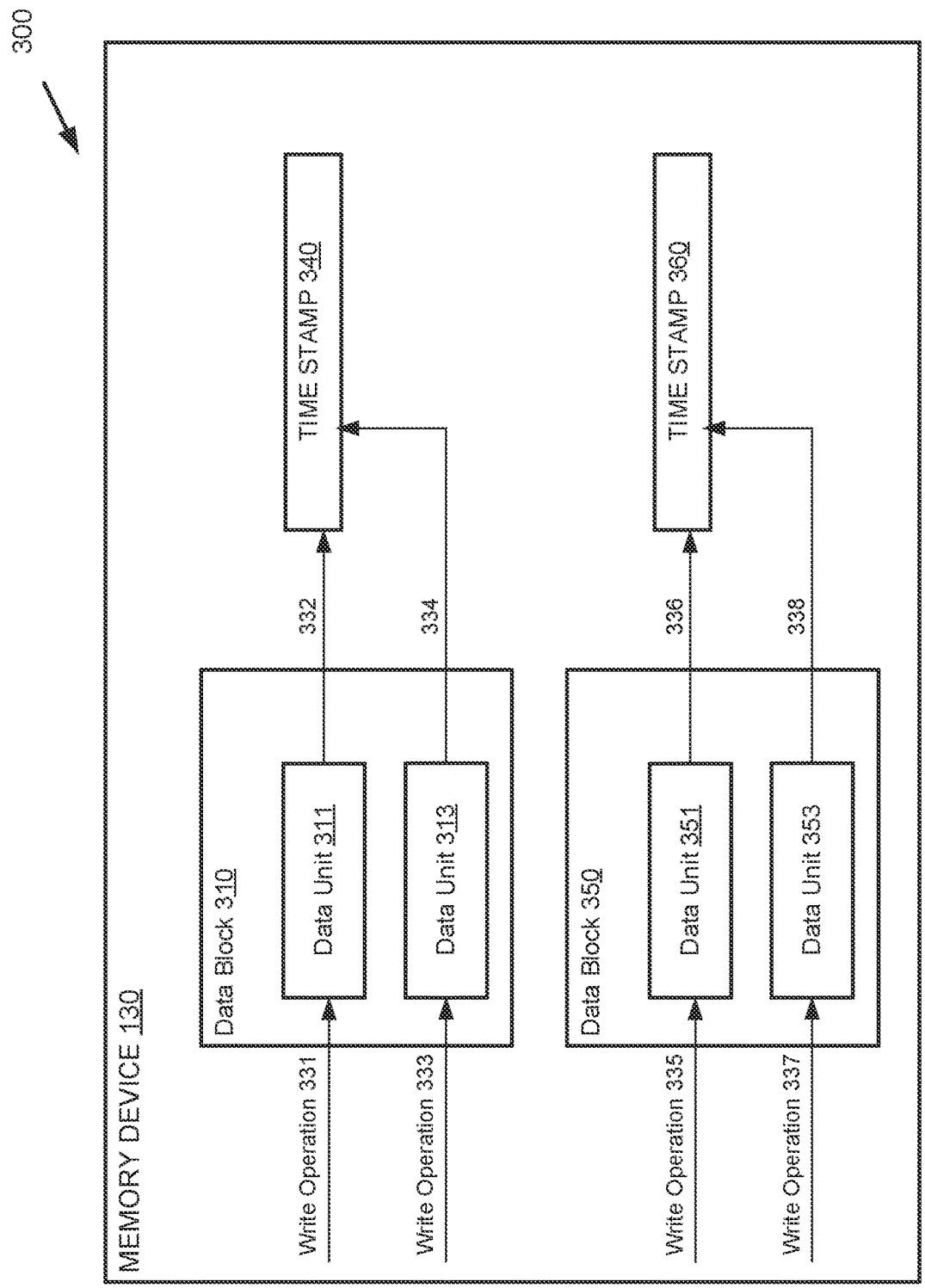
FIG. 3 is a block diagram illustrating the process of managing timestamps for data blocks based on when data is last written to data units of a memory device, in accordance with some embodiments of the present disclosure.

FIG. 3 is a block diagram 300 illustrating the process of managing timestamps for data blocks based on when data is last written to data units of a memory device, in accordance with some embodiments of the present disclosure. In one implementation, memory device 130 can include data blocks 310, 350. A data block can refer to a set of data units within memory device 130. For example, a data block can represent a region of memory comprising 4000 data units. In this example, a data unit can represent a 4000 byte chunk of memory. In other implementations, a data unit can refer to a unit of a memory device used to store data and can include one or more memory pages, one or more memory cells, or one or more word lines. Each data unit can be programmed at a different time.

Data block 310 comprises data units 311, 313 and data block 350 comprises data units 351, 353. Memory device 130 can further include time stamp 340 that can be used to track the time of the most recent write operation performed on a data unit of data block 310. Memory device 130 can also include time stamp 360 that can be used to track the time of the most recent write operation performed on a data unit of data block 350.

At operation 331, the processing logic can receive a write request identifying data unit 311. The write request can include new data to be written to data unit 311. The processing logic can then perform the write operation and can determine that data unit 311 is associated with data block 310, which in turn is associated with time stamp 340. At operation 332, the processing logic can update time stamp 340 to indicate the time that write operation 331 was received at memory device 130. Accordingly, when a pre-read operation is ready to be performed on any data unit of data block 310, the processing logic can read time stamp 340 to determine the W2 W time interval of the data unit as the time elapsed since the time recorded at time stamp 340 (e.g., W2 W time interval=current time−time stored at time stamp 340).

At operation 333, the processing logic can receive a write request identifying data unit 313 and including new data to be written to data unit 313. The processing logic can then perform the write operation and can determine that data unit 313 is associated with data block 310. Similar to the steps performed at operation 332, the processing logic at operation 334 can update time stamp 340 to indicate the time that write operation 333 was received at memory device 130, thus indicating that time stamp 340 can reflect the most recent write operation performed on a data unit of data block 310.

At operation 335, the processing logic can receive a write request identifying data unit 351 of data block 350. The write request can include new data to be written to data unit 351. The processing logic can then perform the write operation and can determine that data unit 351 is associated with data block 350, which in turn is associated with time stamp 360. At operation 336, the processing logic can update time stamp 360 to indicate the time that write operation 335 was received at memory device 130. Accordingly, when a pre-read operation is ready to be performed on any data unit of data block 350, the processing logic can read time stamp 360 to determine the W2 W time interval of the data unit as the time elapsed since the time recorded at time stamp 360 (e.g., W2 W time interval=current time−time stored at time stamp 360).

At operation 337, the processing logic can receive a write request identifying data unit 353 and including new data to be written to data unit 353. The processing logic can then perform the write operation and can determine that data unit 353 is associated with data block 350. Similar to the steps performed at operation 335, the processing logic at operation 338 can update time stamp 360 to indicate the time that write operation 337 was received at memory device 130, thus indicating that time stamp 360 can reflect the most recent write operation performed on a data unit of corresponding data block 350. In implementations, when data block 310 is erased, the processing logic can reset the value of time stamp 340 to a default value, indicating that no data is currently programmed on data block 310, thus indicating that W2 W time interval for a unit within data block 310 should be a minimum value. Similarly, when data block 350 is erased, the processing logic can reset the value of time stamp 360 to a default value, indicating that no data is currently programmed on data block 350.

Figure 4:
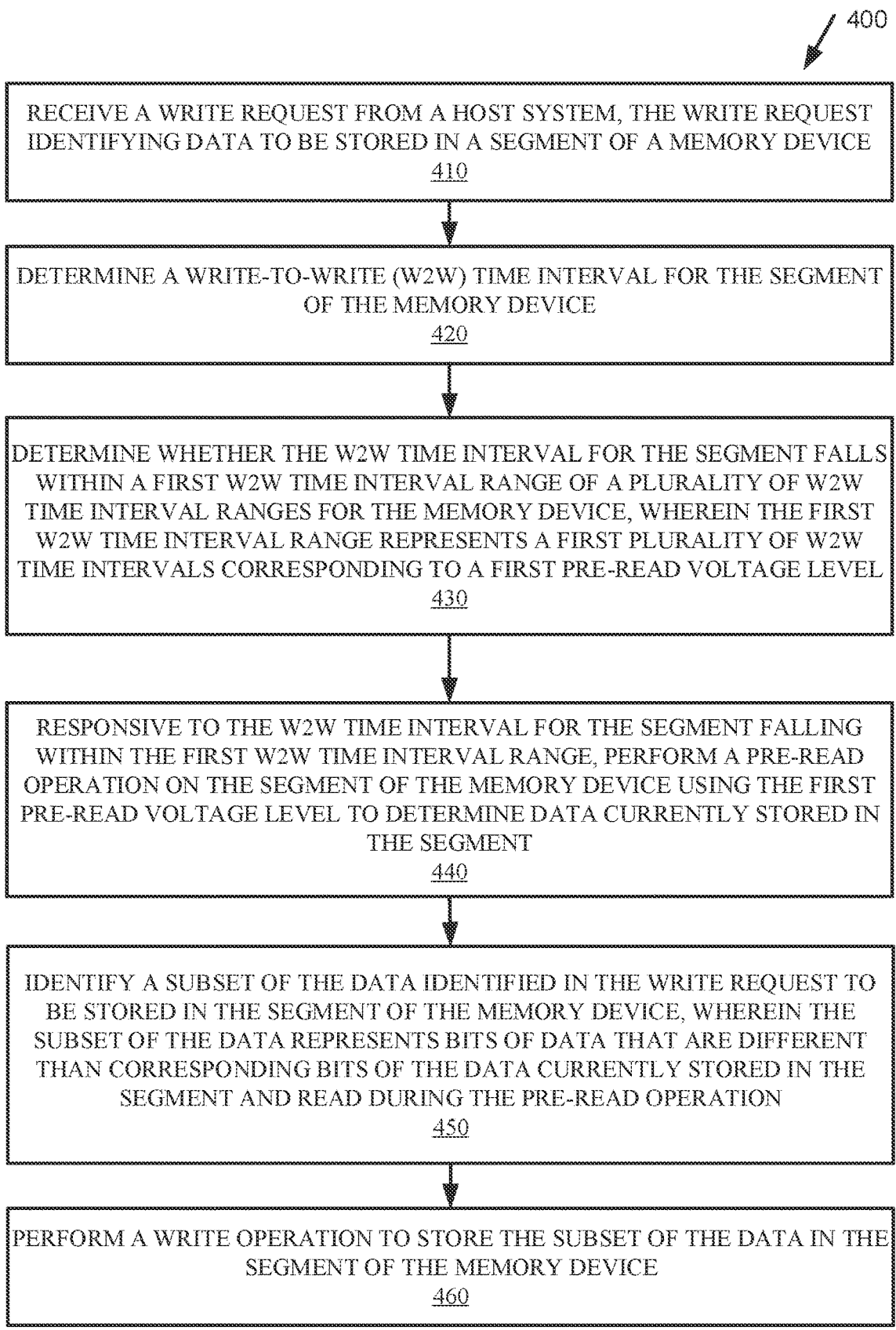
FIG. 4 is a flow diagram of an example method of managing pre-read operations using variable pre-read voltage levels in a memory sub-system, in accordance with some embodiments of the present disclosure

FIG. 4 is a flow diagram of an example method of managing pre-read operations using variable pre-read voltage levels in a memory sub-system, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by pre-read operation management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic receives a write request from a host system, the write request identifying data to be stored in a segment of the memory device. In implementations, the processing logic can execute a pre-read operation before executing the write operation in order to identify the subset of the data to be stored that is different than the data currently stored at the segment, as explained in more details herein. In order to perform the pre-read operation, the processing logic can determine a pre-read voltage level corresponding to the last time data was written to the segment.

At operation 420, the processing logic determines a write-to-write (W2 W) time interval for the segment. In implementations, the W2 W time interval can refer to an interval of time between the last time data was written to the segment and the time the write request was received for the segment. In an example, the last time data was written can be determined according to a time stamp value stored at the memory device representing the last time data has been written to the segment. In other implementations, the W2 W time interval can refer to an interval of time between the last time data was written to any data unit of a group of data units (e.g. a data block associated with the data unit) and the time the write request was received for the data unit. In implementations, a memory device can include multiple data block, and each data block can include multiple data units. For each data block, the processing logic can store a corresponding time stamp value representing the last time data has been written to a data unit within the data block.

At operation 430, the processing device determine a pre-read voltage level by determining whether the W2 W time interval of the segment falls within a first range of W2 W time intervals having a corresponding first pre-read voltage level. In an implementation, the memory device can have multiple ranges of W2 W time intervals, each range represents voltage distribution that results in minimum error rate when the corresponding pre-read voltage level is used for a pre-read operation, as explained in details above.

At operation 440, upon determining that the W2 W time interval of the segment falls within the first range of W2 W time intervals, the processing logic uses the first pre-read voltage of the first range of W2 W intervals to perform the pre-read operation to obtain data currently stored in the segment, as explained in more details herein above. In certain implementations, the processing logic can execute an error handling module with the data obtained from the pre-read operation in order to correct errors that may exist in the data read during the pre-read operation. For example, the error handling module can perform the pre-read operation again, using a different pre-read voltage level that is determined by the error handling module to yield a better error rate for the pre-read operation. The processing logic can then updated the pre-read voltage level of the first range of W2 W intervals to reflect the pre-read voltage level determined by the error handling module.

At operation 450, the processing device identifies a subset of the new data to be stored at the segment and only write the subset to the segment. The subset of data represents that portion of the new data that is different than the data currently stored in the segment. In an example, the processing logic can compare each bit of the data currently stored in the segment with a corresponding bit of the new data to be stored at the segment and only write to the segment those bits of the new data that are different that the corresponding bits of the data currently stored in the segment, as explained in more details herein.

At operation 460, the processing logic performs a write operation to store in the segment the subset of the new data that are different than the data currently stored in the segment, based on the above described comparison, as explained in more details herein.

Figure 5:
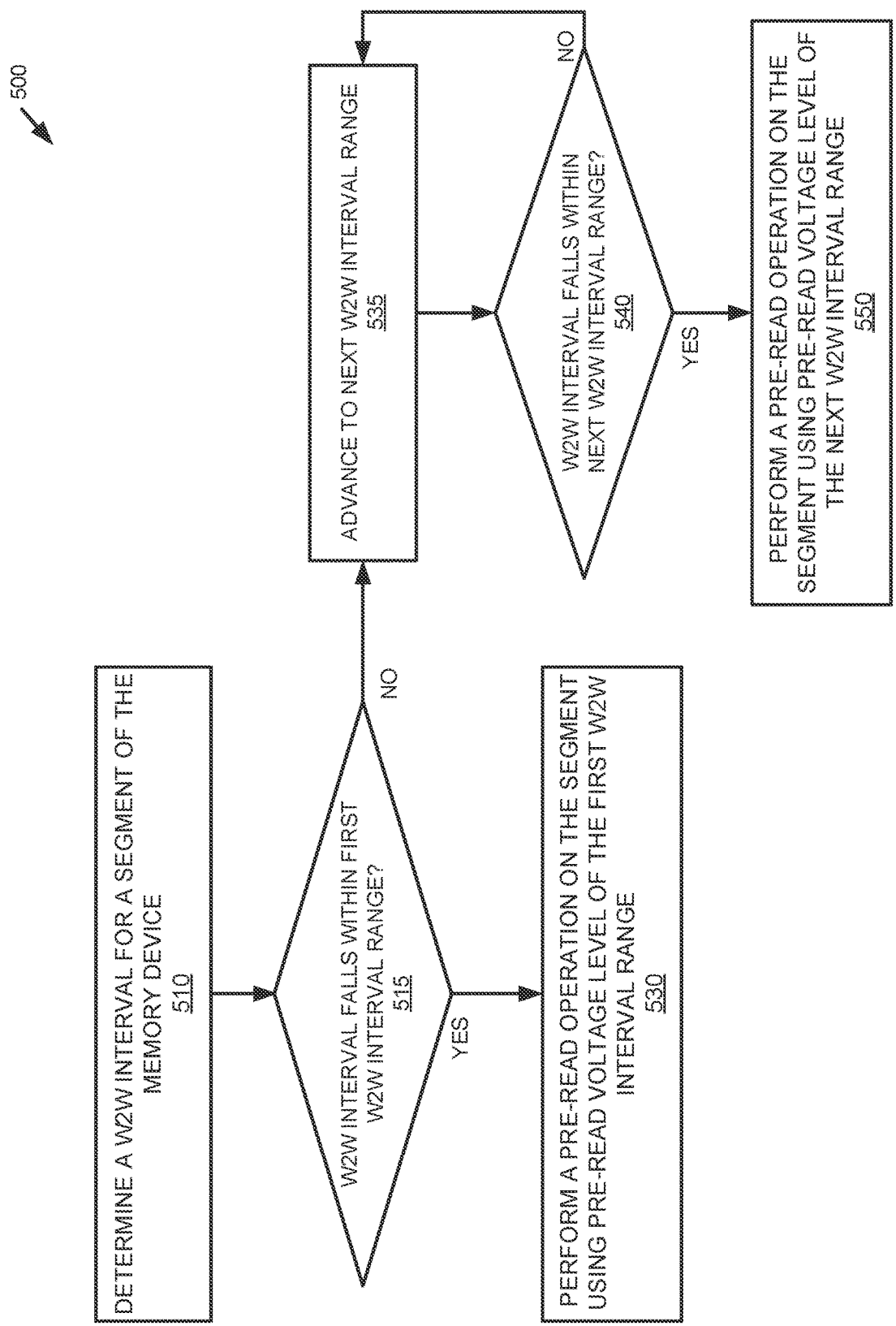
FIG. 5 is a flow diagram of an example method of performing a pre-read operation using a variable pre-read voltage level in a memory sub-system, in accordance with some embodiments of the present disclosure

FIG. 5 is a flow diagram of an example method of performing a pre-read operation using a variable pre-read voltage level in a memory sub-system, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by pre-read operation management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic determines a write-to-write (W2 W) time interval for a segment of the memory device, for example, in order to perform a pre-read operation to obtain data stored at the segment before performing a write operation, as explained in details herein. In implementations, the W2 W time interval can be used to determine a pre-read voltage level to be used for performing the pre-read operation. In other implementations, for performing the pre-read operation on the segment, the processing logic can determine a pre-read voltage level that satisfies a pre-read voltage level criterion. The pre-read voltage level criterion can be whether the W2 W time interval of the segment falls within a range of W2 W intervals associated with the pre-read voltage level.

At operation 515, the processing logic determines whether the W2 W interval falls within a first range of W2 W intervals. In one implementation, the memory device can contain multiple ranges of W2 W intervals, each range corresponds to a respective pre-read voltage level, as explained in details herein. At operation 530, when the processing logic determines that the W2 W interval falls within the first range of W2 W intervals, the processing logic can use the first pre-read voltage of the first range of W2 W intervals to perform the pre-read operation. The processing logic then performs the pre-read operation using the first pre-read voltage level to obtain data currently stored at the segment, as explained n details above.

At operation 535, if the processing logic determines that the W2 W interval of the segment does not fall within the first range of W2 W intervals, the processing logic can advance to the next range of the multiple ranges of W2 W intervals of the memory device and can determine if the W2 W interval falls within the next range of W2 W intervals, at operation 540. At operation 550, if the processing logic determines that the W2 W interval of the segment falls within the next range of W2 W intervals, the processing logic can perform the pre-read operation using the pre-read voltage level of the next range of W2 W intervals to obtain data currently stored at the segment, as explained n details above.

If the processing logic determines that the W2 W interval of the segment does not fall within the next range of W2 W intervals, the processing logic can advance to the next (e.g., third) range of W2 W intervals of the multiple ranges of W2 W intervals of the memory device, at operation 535. The processing logic can continue to loop through the multiple ranges of W2 W intervals until a range of W2 W intervals that contains the W2 W interval of the segment is found. The processing logic can then proceed to use the pre-read voltage of the found range of W2 W intervals to perform the pre-read operation.

Figure 6:
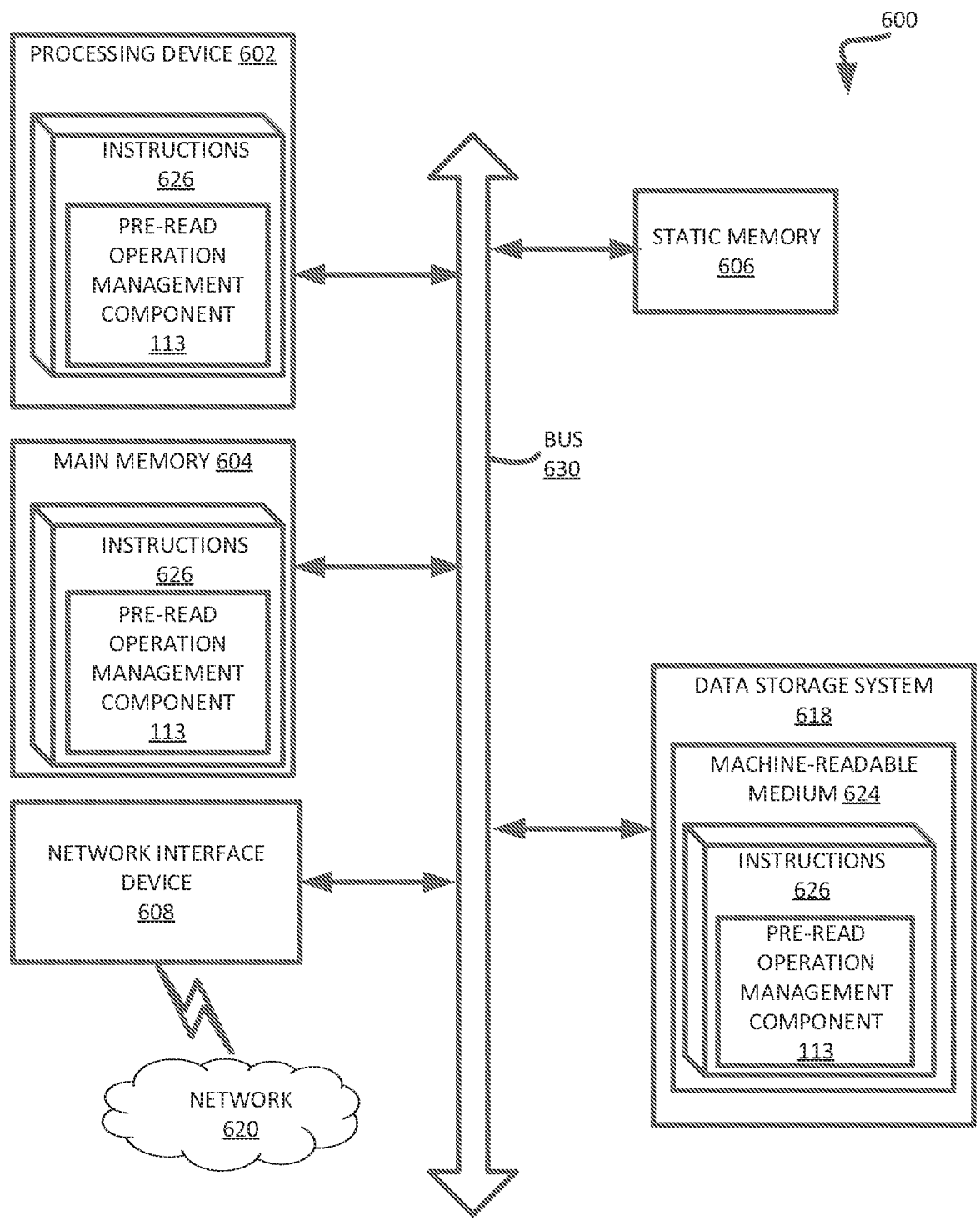
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to pre-read operation management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to pre-read operation management component 113 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
  a memory device; and
  a processing device, operatively coupled with the memory device, to perform operations comprising:
    receiving a write request from a host system at a first time, the write request identifying first data to be stored in a segment of the memory device;
    determining whether a pre-read voltage level of the write request satisfies a pre-read voltage level criterion pertaining to a write-to-write time interval for the segment, wherein the write-to-write time interval is defined by the first time and a second time corresponding to a last time at which the segment was written; and
    responsive to determining that the pre-read voltage level satisfies the pre-read voltage level criterion pertaining to the write-to-write time interval, performing a pre-read operation on the segment using the pre-read voltage level to determine second data currently stored in the segment.

2. The system of claim 1, wherein the operations further comprise:
  reading a timestamp indicating the second time; and
  determining the write-to-write time interval as an elapsed time between the second time indicated by the timestamp and the first time.

3. The system of claim 1, wherein the segment comprises a plurality of data units, each data unit of the plurality of data units comprising a smallest amount of memory on which a write operation is performed.

4. The system of claim 3, wherein the write-to-write time interval is determined based on a timestamp associated with a most recently written data unit of the plurality of data units.

5. The system of claim 1, wherein the operations further comprise:
  responsive to determining that the pre-read voltage level fails to satisfy the pre-read voltage level criterion pertaining to the write-to-write time interval, performing the pre-read operation on the segment using a second pre-read voltage level different from the first pre-read voltage level.

6. The system of claim 1, wherein the first pre-read voltage level is a lowest pre-read voltage level of a plurality of pre-read voltage levels associated with the memory device.

7. The system of claim 1, wherein the operations further comprise:
  identifying a subset of the first data, the subset of the first data representing bits of the first data that are different than corresponding bits of the second data, wherein identifying the subset of the first data comprises:
    comparing a first set of bits of the second data and read during the pre-read operation with a second set of bits of the first data; and
    marking bits of the second set of bits that do not match corresponding bits of the first set of bits as the subset of the first data; and
  storing the subset of the first data in the segment.

8. A method comprising:
  receiving, by a processing device, a write request from a host system at a first time, the write request identifying first data to be stored in a segment of the memory device;
  determining, by the processing device, whether a pre-read voltage level of the write request satisfies a pre-read voltage level criterion pertaining to a write-to-write time interval for the segment, wherein the write-to-write time interval is defined by the first time and a second time corresponding to a last time at which the segment was written; and
  responsive to determining that the pre-read voltage level satisfies the pre-read voltage level criterion pertaining to the write-to-write time interval, performing, by the processing device, a pre-read operation on the segment using the pre-read voltage level to determine second data currently stored in the segment.

9. The method of claim 8, further comprising:
  reading a timestamp indicating the second time; and determining the write-to-write time interval as an elapsed time between the second time indicated by the timestamp and the first time.

10. The method of claim 8, wherein the segment comprises a plurality of data units, each data unit of the plurality of data units comprising a smallest amount of memory on which a write operation is performed.

11. The method of claim 10, wherein the write-to-write time interval is determined based on a timestamp associated with a most recently written data unit of the plurality of data units.

12. The method of claim 8, further comprising:
responsive to determining that the pre-read voltage level fails to satisfy the pre-read voltage level criterion pertaining to the write-to-write time interval, performing, by the processing device, the pre-read operation on the segment using a second pre-read voltage level different from the first pre-read voltage level.

13. The method of claim 8, wherein the first pre-read voltage level is a lowest pre-read voltage level of a plurality of pre-read voltage levels associated with the memory device.

14. The method of claim 8, further comprising:
identifying, by the processing device, a subset of the first data, the subset of the first data representing bits of the first data that are different than corresponding bits of the second data, wherein identifying the subset of the first data comprises:
comparing a first set of bits of the second data and read during the pre-read operation with a second set of bits of the first data; and
marking bits of the second set of bits that do not match corresponding bits of the first set of bits as the subset of the first data at the segment; and
storing, by the processing device, the subset of the first data in the segment.

15. A non-transitory computer-readable storage medium comprising instructions that, when executed by a processing device, cause the processing device to perform operations comprising:
receiving a write request from a host system at a first time, the write request identifying first data to be stored in a segment of the memory device;
determining a write-to-write time interval for the segment defined by the first time and a second time corresponding to a last time at which the segment was written;
determining whether the write-to-write time interval falls within a first write-to-write time interval range corresponding to a first pre-read voltage level;
responsive to the write-to-write time interval falling within the first write-to-write time interval range, performing a pre-read operation on the segment of the memory device using the first pre-read voltage level to determine second data currently stored in the segment;
identifying a subset of the first data, wherein the subset of the first data represents bits of the first data that are different than corresponding bits of the second data; and
storing the subset of the first data in the segment.

16. The non-transitory computer-readable storage medium of claim 15, wherein the operations further comprise reading a timestamp indicating the second time, and wherein the write-to-write time interval is determined as an elapsed time between the second time indicated by the timestamp and the first time.

17. The non-transitory computer-readable storage medium of claim 15, wherein the segment comprises a plurality of data units, each data unit of the plurality of data units comprising a smallest amount of memory on which a write operation is performed, and wherein the write-to-write time interval is determined based on a timestamp associated with a most recently written data unit of the plurality of data units.

18. The non-transitory computer-readable storage medium of claim 15, wherein the operations further comprise:
responsive to determining that the pre-read voltage level fails to satisfy the pre-read voltage level criterion pertaining to the write-to-write time interval, performing the pre-read operation on the segment using a second pre-read voltage level.

19. The non-transitory computer-readable storage medium of claim 15, wherein the first pre-read voltage level is a lowest pre-read voltage level of a plurality of pre-read voltage levels associated with the memory device.

20. The non-transitory computer-readable storage medium of claim 15, wherein identifying the subset of the first data comprises:
comparing a first set of bits of the second data with a second set of bits of the first data; and
marking bits of the second set of bits that do not match corresponding bits of the first set of bits as the subset of the first data.

* * * * *